United States Patent [19]

Stephens

[11] Patent Number: 5,059,917
[45] Date of Patent: Oct. 22, 1991

[54] OPTICAL PHASE CONJUGATION APPARATUS INCLUDING LIGHT PIPE FOR MULTIPLE BEAM COMBINATION

[75] Inventor: Ronald R. Stephens, Westlake Village, Calif.

[73] Assignee: Hughes Aircraft Company, Los Angeles, Calif.

[21] Appl. No.: 511,665

[22] Filed: Apr. 20, 1990

[51] Int. Cl.$^5$ .................. H01S 3/098; H01S 3/98
[52] U.S. Cl. ........................ 330/4.3; 385/123
[58] Field of Search ............ 330/4.3; 350/96.13, 350/96.19, 96.25; 372/21

[56] References Cited

U.S. PATENT DOCUMENTS

| | | | |
|---|---|---|---|
| 1,981,999 | 11/1934 | French | 350/96.19 |
| 4,794,605 | 12/1988 | Aprahamian et al. | 330/4.3 |
| 4,907,851 | 3/1990 | Mahric | 350/96.19 |
| 4,927,251 | 5/1990 | Schaen | 350/354 |
| 4,943,782 | 7/1990 | Stephens et al. | 330/4.3 |
| 4,944,591 | 7/1990 | McMichael | 356/350 |

FOREIGN PATENT DOCUMENTS

WO89/09505  10/1989  World Int. Prop. O.

OTHER PUBLICATIONS

Appl. Phys. Lett 50(1), Mar. 16, 1987, "Phase Conjugate Master Oscillator-Power Amplifier Using BaTiO$_3$ and AlGaAs Semiconductor Diode Lasers", R. R. Stephens et al., pp. 647–649.

Tonita et al.; "Polarization and Spatial . . . Applications;" IEEE JQB, vol. 25, #3, pp. 315–338, 3/89; abstract supplied.

O'Meara, T. B.; "Correction of Phase . . . Techniques", NTIS AO–AO 66/48/81 3/79, 135pp; abst. only supplied.

*Primary Examiner*—Nelson Moskowitz
*Attorney, Agent, or Firm*—V. D. Duraiswamy; W. K. Denson-Low

[57] ABSTRACT

A rectangular light pipe (38) and associated optical elements (36), (40) are used to produce an overlapped combination of an array of aberrated laser beams (32), (34) inside a phase conjugate mirror (42). The beam array (32), (34) is focussed onto the entrance face (38a) of the light pipe (38) in such a way that each beam (32), (34) spreads by diffraction and internal reflections to fill the exit face (38b) of the light pipe (38). An image of the exit face (38b), which is completely filled by the overlapped beams (32), (34), is focussed into the phase conjugate mirror (42) such as to produce an overlap spot (46) size which is independent of beam aberation level. The apparatus preserves the linear polarization of the input beams (32), (34), has low optical loss, and may be incorporated into a 2 pass (50), (74) or 4 pass (80) phase conjugate master-oscillator power amplifier.

22 Claims, 2 Drawing Sheets

OPTICAL PHASE CONJUGATION APPARATUS INCLUDING LIGHT PIPE FOR MULTIPLE BEAM COMBINATION

GOVERNMENT RIGHTS

This invention was made with Government support under Contract No. F29601-87-C-0029 awarded by the Department of the Air Force. The Government has certain rights in this invention.

BACKGROUND OF THE INVENTION

1. Field of the Invention

The present invention generally relates to non-linear optical phase conjugation, and more specifically to an apparatus for combining an array of parallel light beams for phase conjugation and amplification in a master oscillator-power amplifier configuration.

1. Description of the Related Art

A phase conjugate master oscillator-power amplifier (PC MOPA) includes a laser for producing a coherent, high quality light beam which is split into an array of parallel input beams. A power amplifier which may include a laser diode amplifier array amplifies the input beams, which are then directed into a phase conjugate mirror. The beams are phase conjugated and reflected back through the power amplifier and then directed out of the apparatus. The resulting output beam is amplified twice by the power amplifier, and is very clean since no aberrations remain after the two passes through the amplifier. The phase conjugate mirror has the property such that it reverses the sign of the phase of any wave reflected from it. Thus, any phase aberrations picked up by the beams on their first pass through the amplifier exactly cancel out after the second pass. In particular, any phase errors produced by optical path length differences between amplifier elements are compensated for by the conjugation process.

A problem has existed in prior art PC MOPA systems with one- or two-dimensional arrays of amplifiers, and a phase conjugate mirror including crystalline barium titanate (BaTiO$_3$) whose operation is sensitive to spot size. The parallel light beams must be imaged into a single overlapped spot in the phase conjugator which is invariant with the aberration level of the amplifier. This has been accomplished in the past using conventional optical elements such a wedges and mirrors to process each light beam individually. This expedient is reasonable for small numbers of light beams, but is beyond the limits of practicality for hundreds or thousands of light beams.

For a laser diode PC MOPA to function properly, the aberrations picked up by the input beams on the first pas through the amplifiers must be phase conjugated so that they will be removed on the second pass. Effective phase conjugation can occur only if all the aberration information in the beams is conveyed to the phase conjugator in a useful form. This means that the optical system must collect all of the aberrated beams, and that these beams must be presented to the phase conjugator with the proper size, shape, etc. to enable the conjugator to function. Phase conjugation using barium titanate at aluminum gallium arsenide (AlGaAs) laser diode wavelengths on the order of 830 nm is particularly critical, since if the beam diameter inside the phase conjugator crystal differs by more than ±30% from 0.75 mm, either the phase conjugation process will not start, or poor reflectivity will result.

FIG. 1 illustrates a light beam propagating from left to right as viewed in the drawing, and being emitted from a power amplifier 10 after a first pass therethrough. At low amplifier drive current, the output is nearly diffraction limited (non-aberrated) and has low divergence as indicated by solid lines 12. At higher currents, the divergence increases as indicated by broken lines 14 due to higher aberration levels, typically degrading to five times the diffraction limit or worse. If an associated phase conjugate mirror is to function over a wide range of drive currents without major adjustments to the optical system, a portion of the output beam which does not change in size with aberration level must be used inside the barium titanate crystal. As illustrated in FIG. 1, the only portion of the light beam that does not change is a near field (amplifier exit facet or image thereof) 16, since it is constrained by the amplifier dimensions. Thus, in a PC MOPA that utilizes a single amplifier, proper operation of the phase conjugator may be achieved by using a conventional lens system to image the exit facet of the amplifier into the phase conjugator crystal.

However, the exclusive use of lenses cannot cause the near fields of an array of light beams to come together at a single point since the amplifiers are spatially separated, and this separation will be maintained in the image. As illustrated in FIG. 2, an array of parallel light beams 18 emerging from a plurality of respective amplifiers 10 are imaged through a lens 20 located at twice the focal length f of the lens 20 from the amplifiers 10. Images of the beams 18 overlap at a far field 22 which is located one focal length f from the lens 20. A far field is a point at which the intensity profile reaches a steady state, and no longer changes with a further increase in distance. However, the beam size is not invariant with the aberration levels of the amplifiers 10, and will increase as the amplifier current and thereby the aberration level increase. The images of the beams 18 are focussed at a near field 24, but are spatially separated from each other.

It is possible to achieve near field image overlap by individually deflecting the light beams 18 to a common point 26 in space using respective mirrors or optical wedge 28 as illustrated in FIG. 3. For rectangular arrays, each mirror or wedge can be made to deflect a row or column of beams so that as few as N+M−2 elements are required for an N×M array (where N and M are odd). However, for arrays with hundreds or thousands of amplifiers and respective light beams, the number of deflecting elements becomes unmanageable. Even if the elements are all fabricated on the same substrate (e.g. a multifaceted axicon or multi-element binary optic array), the resulting element will be complex and expensive. It will also be necessary to fabricate a new element if even small changes are made to the rest of the system.

Light pipes or optical fibers per se have been used in optical systems which include phase conjugate mirrors. An example is found in a paper entitled "Image transmission and interferometry with multimode fibers using self-pumped phase conjugation", by B. Fischer et al, *Applied Physics Letters* 46 (2), 15 Jan. 1985, pp. 113–114. This reference describes a double-pass image transmission through a single multimode fiber, using a passive phase conjugate mirror. As an application to interferometry based on phase sensing, the multimode fiber and passive phase conjugate mirror were implemented as one arm of a Michelson interferometer. Due to the unique properties of the self-pumped conjugator, nonuniform distortions caused by modal dispersion in the fiber and other aberrations were canceled out, while uniform phase changes were detected.

The Fischer paper teaches how to use a phase conjugate mirror to cancel aberrations in a single light beam propagating through an optical fiber, and does not suggest a solution to the problem of variation in overlap spot size in a phase conjugate mirror used in a PC MOPA which includes a plurality of light beams and amplifiers.

SUMMARY OF THE INVENTION

The present invention solves the optical problem encountered in the phase conjugator section of laser diode PC MOPAs which employ either one- or two-dimensional arrays of amplifiers, and a phase conjugator whose operation is sensitive to spot size (e.g. barium titanate). In accordance with the present invention, a single light pipe replaces the large number of individual lenses, optical wedges, etc. which have been required in the prior art for producing an overlapped image of a plurality of light beams at a single spot in the conjugator. In addition to substantial savings in cost and system complexity, the present apparatus is relatively easy to fabricate and simple to align.

More specifically, the present invention provides a method of optically combining a plurality of parallel light beams using an optical light pipe or fiber, and a PC MOPA or other apparatus embodying the method. A rectangular light pipe and associated optical elements are used to produce an overlapped combination of an array of aberrated laser beams inside a phase conjugate mirror. The beam array is focussed onto the entrance face of the light pipe in such a way that each beam spreads by diffraction and internal reflections to fill the exit face of the light pipe. An image of the exit face, which is completely filled by the overlapped beams, is focussed into the phase conjugate mirror such as to produce an overlap spot size which is independent of beam aberration level. The apparatus preserves the linear polarization of the input beams, has low optical loss, and may be incorporated into a two pass or a four pass PC MOPA.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
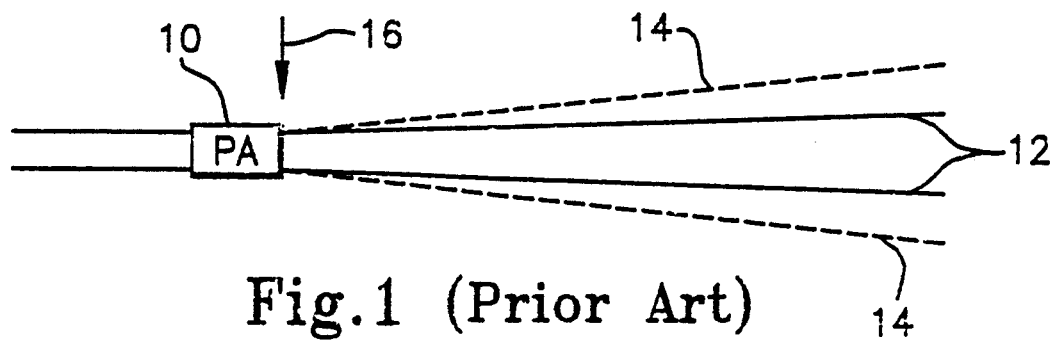
FIGS. 1, 2 and 3 are diagrams illustrating the operation of prior art PC MOPAs.
Figure 2:
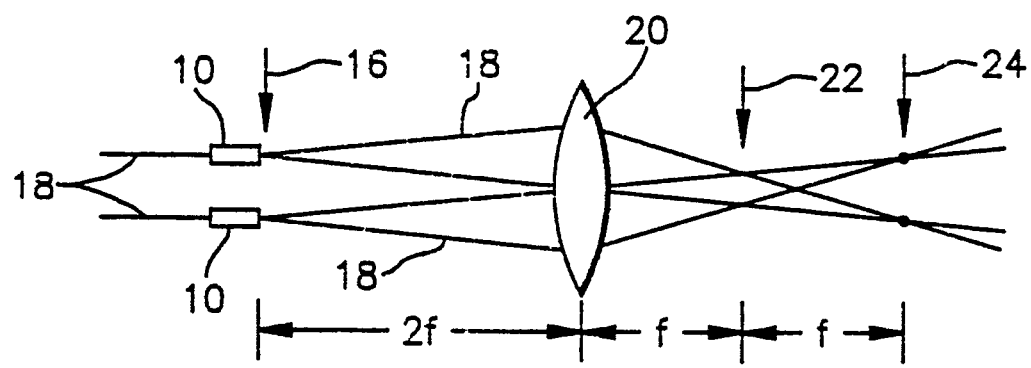
Figure 3:
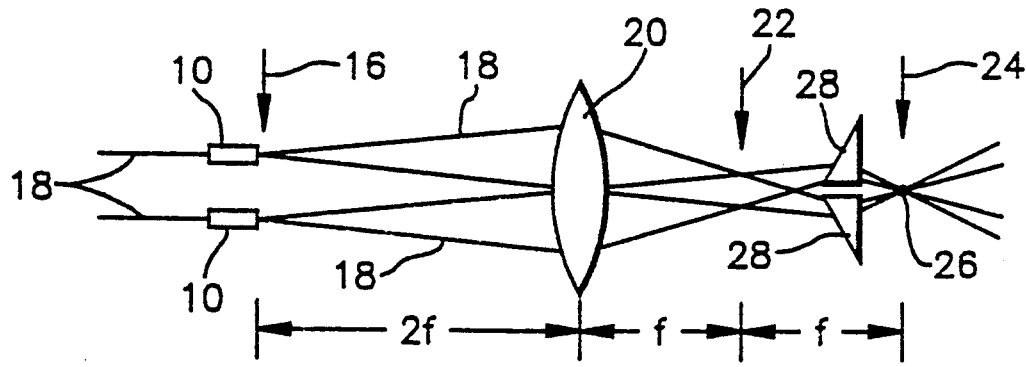
Figure 4:
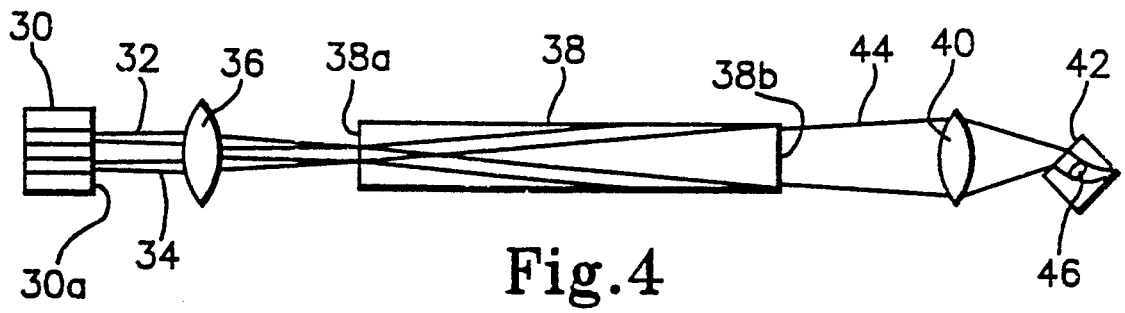
FIG. 4 is a diagram illustrating the principle of operation of the present invention.

Referring now to FIG. 4 of the drawing, a power amplifier array 30 such as an array of laser diode amplifiers is provided to amplify parallel light beams 32 and 34 passing therethrough. Although only two light beams are illustrated for the purpose of describing the principles of the invention, in a practical application the array 30 will be a rectangular, and include tens or hundreds of amplifiers for amplifying individual light beams passing therethrough.

A first optical unit, symbolically illustrated as a converging lens 36, is used to focus an image of an exit face or facet 30a of the amplifier array 30 onto an entrance face or facet 38a of an optical fiber or light pipe 38. The focussed image consists of near field image spots of the individual light beams 32 and 34. The light pipe 38 has a rectangular cross section, which is selected such that the collective image of the light beams 32 and 34 just fills or fits into the entrance face 38a.

After entering the face 38a, the light beams 32 and 34 spread by diffraction and internal reflection to overlap and combine with each other, and fill an exit face or facet 38b of the light pipe 38. The length of the light pipe 38 is selected such that the light beams 32 and 34 will diverge to fill the exit face 38b under diffraction limited conditions of the array 30. An image of the exit face 38b is focussed by a second optical unit, symbolically illustrated as a converging lens 40, into an optical phase conjugate mirror 42. Although not illustrated in detail, the mirror 42 may comprise a crystal of barium titanate having its crystallographic axes oriented at suitable angles to produce optical phase conjugate reflection of the light beams focussed therein by the optical unit 40. Alternatively, the mirror 42 may include another suitable type of phase conjugate cell such as a stimulated Brillouin scattering (SBS) cell. The light beams 32 and 34, after being overlapped and combined in the light pipe 38, are designated as 44, and focussed by the optical unit 40 into the mirror 42 to form a spot 46 at a predetermined position therein and having a predetermined diameter. For barium titanate, the predetermined diameter is approximately 0.75 mm.

In accordance with an important feature of the present invention, although the combined light beams 44 are aberrated by the amplifiers in the array 30 and also by propagation through the light pipe 38, the spot 46 is an image of the exit face 38b of the light pipe 38 and will not vary in size as the aberration level of the array 30 changes. This enables the phase conjugate mirror 42 to function properly over a wide range of operating current levels, and thereby aberration levels of the amplifier array 30 without the provision of a large number of lenses and optical wedges as is required in the prior art.

In a practical application, the optical unit 36 will include both spherical and cylindrical lens elements (not shown) so that the array 30 can be imaged differently in the vertical and horizontal directions. A half wave plate (not shown) may also be included to adjust the polarization state.

The optical unit 36 and light pipe 38 are preferably designed to fulfill the following conditions.

(1) The entire image of the exit face 30a of the array 30 fits within the boundaries of the entrance face 38a of the light pipe 38.

(2) The image spots of the individual light beams 32 and 34 are sufficiently small that under operating conditions in which the amplifiers of the array 30 are diffraction limited, the beams 32 and 34 will spread by diffraction within the light pipe 38 so as to just fill the exit face 38b of the pipe 38.

(3) The centerlines of the light cones forming the image spots of the light beams are parallel to the light pipe walls.

(4) The polarization of the image spots of the light beams 32 and 34 on the entrance face 38a of the light pipe 38 are parallel and perpendicular to the light pipe walls. The polarization vectors of the light beams 32 and 34 at the entrance face 38a are orthogonal, and parallel to the respective rectangular or orthogonal walls of the light pipe 38.

As the aberration level of the amplifiers in the array 30 changes, the dimensions of the image spots of the light beams on the entrance face 38a remain constant. Thus, if condition (1) is satisfied, all of the light will enter the light pipe 38 even when large aberrations are introduced in the array 30. Inside the light pipe 38, the divergence angles of the light beams 32 and 34 increase as the aberrations increase, thereby causing the light beams to make more bounces off the walls of the light pipe 38. However, the light will be completely contained by total internal reflection (TIR) within the light pipe even at large angles of incidence with the walls. Since the light beams diverge to just fill the exit face 38b of the light pipe when no aberrations are present in accordance with condition (2), the exit face 38b will be filled with combined and overlapped beams for all aberration levels, and the size of the spot 46 in the phase conjugate mirror 42 will be fixed under all operating conditions.

The upper limit for how badly the light beams 32 and 34 can be distorted in the array 30 and still be effectively handled by the light pipe arrangement is determined by the numerical apertures of the light pipe 38 and the optical units 36 and 40. The most basic configuration of the light pipe 38 is a simple rectangular prism of glass with the TIR occurring off the glass-air interface. For a glass refractive index of n=1.51, TIR will occur for angles as small as 41.5 degrees to the normal of the walls of the light pipe 38. Since, by Snell's Law, grazing incidence at the entrance face 38a will give angles of only 48.5 degrees to the light pipe wall normal (smallest possible angle), all light that is coupled into the light pipe 38 will be reflected by TIR and remain in the pipe 38. The numerical apertures of the optical units 36 and 40 are thus the limiting factors in the aberration handling capabilities of the system for a basic light pipe. These can be handled by conventional optical design methods. Condition (3) aids in maximizing the aberration handling capability of the optical unit 40 by reducing the spread angle of the combined light beams 44 exiting the light pipe 38. If the centerlines of the input light beams are not parallel to the light pipe walls, the numerical aperture of the optical unit 40 must be made larger to accommodate a given degree of aberration.

The light pipe 38 is preferably made rectangular to avoid polarization scrambling. Since barium titanate requires linear polarized light, any polarization scrambling produced by the light pipe 38 would have to be corrected by additional optical elements such as a polarizing beam splitter, half wave plate and mirrors, etc., between the exit face 38b and the phase conjugate mirror 42. These would limit the numerical aperture of the optical unit 40, and increase the system complexity and losses. The main source of polarization scrambling in short pipes results from differences in phase shift (DPS) encountered by S and P polarized light reflected from the pipe walls. For internal reflection, DPS is greater than 45 degrees at 51 degrees to the pipe wall normal, and falls off to zero at grazing incidence and at the critical angle of 41.5 degrees. Unless the polarization is either S or P when the beam is incident on a pipe wall, the polarization will rapidly become highly elliptical after only a few reflections. The only way to achieve pure S or P polarization at all reflections is to use a rectangular light pipe, and orient the input polarizations parallel and perpendicular to the pipe walls as in condition (4).

The entrance face 38a of the light pipe 38 should not be made significantly larger than the image of the input light beams 32 and 34, as this will adversely affect the performance of the optical system 40 and the phase conjugate mirror 42. If the light pipe 38 is made longer than required for the light beams 32 and 34 to just fill the exit face 38b under diffraction limited conditions, there will not be a dramatic degradation in the performance of the system. However, the system will be larger than necessary, and the light beams 32 and 34 will make more bounces off the walls of the light pipe 38, resulting in small optical losses. In addition, the additional bounces increase the complexity of the information which must be reversed by the phase conjugate mirror 42, and may constitute a limiting factor under some design conditions.

The length L of the light pipe to fulfill condition (2) such that the input light beams diverge to just fill the exit face of the pipe under diffraction limited conditions may be determined empirically, or calculated mathematically by approximating the beams as having a Gaussian or flat top (top hat) profile.

For the Gaussian approximation, $L = \omega_0 \cdot r \cdot \pi \cdot n / \lambda$, where $\omega_0$ is the beam waist radius at the input face of the light pipe, r is the radius of the diffraction limited beam at the exit face of the light pipe, $\lambda$ is the wavelength of the light beam, and n is the index of refraction of the light pipe.

For the flat top approximation, $L = a \cdot r \cdot n / \lambda$, where $a$ is the near field width of the flat top beam.

Figure 5:
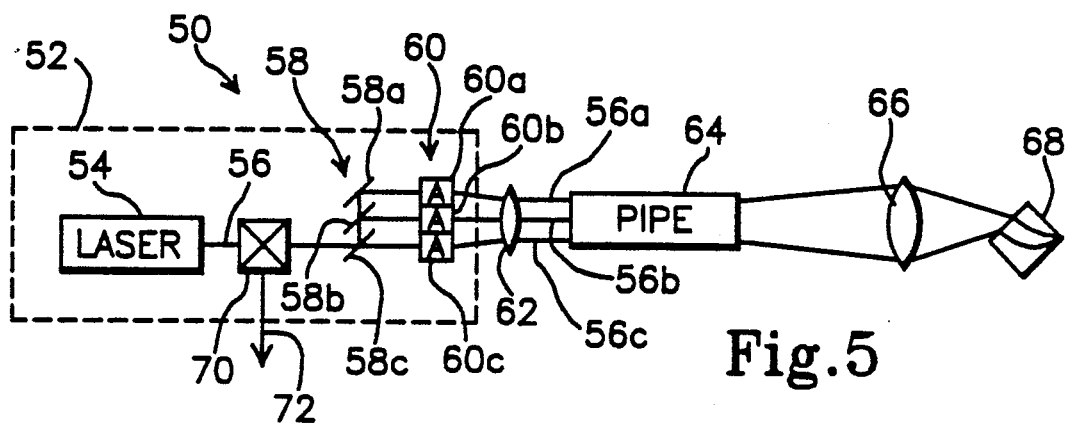
FIGS. 5, 6 and 7 are diagrams illustrating alternative configurations of PC MOPAs embodying the present invention.

FIGS. 5 to 8 illustrate alternative PC MOPA configurations embodying the present invention, with like elements being designated by the same reference numerals. In FIG. 5, a two pass PC MOPA is generally designated as 50, and includes a light source unit 52. A master oscillator or light source of the unit 52 is provided in the form of a laser 54 for producing a single coherent light beam 56 of diffraction limited quality. The light beam 56 is split into a plurality of parallel input light beams 56a, 56b and 56c by a beam splitter 58 including beam splitting plane mirrors 58a, 58b and 58c respectively. The parallel light beams 56a, 56b and 56c, are passed through an amplifier array 60 including, for example, individual laser diode amplifier cells 60a, 60b and 60c. The amplified light beams 56a, 56b and 56c are directed by a first optical unit 62 into a light pipe 64 in the manner described above with reference to FIG. 4. A second optical unit 66 focusses the light beams 56a, 56b and 56c after combination thereof in the light pipe 64 into a phase conjugate mirror 68. The mirror 68 phase conjugates and reflects the combined light beams 56a, 56b and 56c back through the light pipe 64, amplifier array 60, and beam splitter 58 to an optical beam switching unit 70, which may include conventional polarization rotation optics (not shown), and reflects the light beam incident thereon out of the apparatus 50 as an output beam 72.

Due to the action of the phase conjugate mirror 68, all of the beam splitting, overlapping and combining which was performed on the input beam 56 is reversed in the output beam 72. The beam 72 is essentially similar to the input beam 56, except that its energy has been substantially increased by two passes through the amplifier array 60. All aberrations introduced in the amplifier array 60 and light pipe 64 are reversed and thereby eliminated by the optical phase conjugation.

Figure 6:
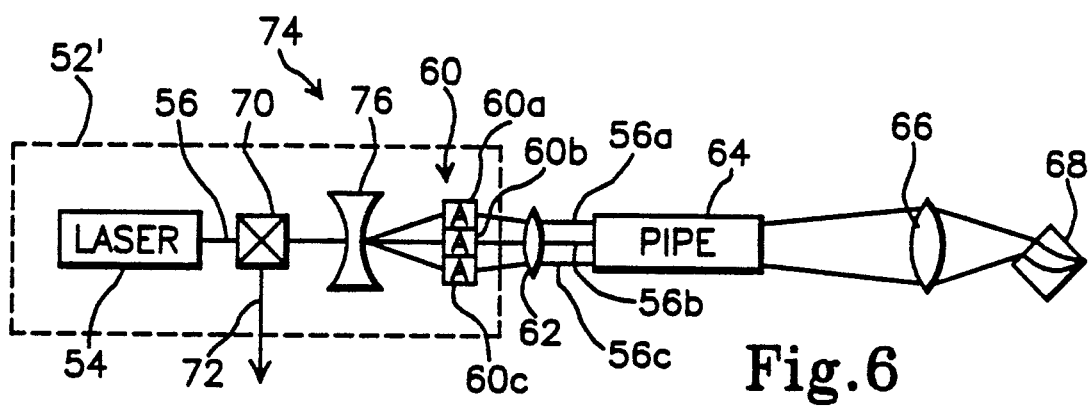

FIG. 6 illustrates another PC MOPA 74 which is essentially similar to that illustrated in FIG. 5, except that the beam splitter 58 in the light source unit 52 has been replaced by an optical beam expander 76 in a light source unit 52' which is symbolically illustrated as a diverging lens. The beam expander 76 performs a function equivalent to the beam splitter 58 by diverging the beam 56 so that it illuminates all of the amplifier cells 60a, 60b and 60c of the array 60.

Figure 7:
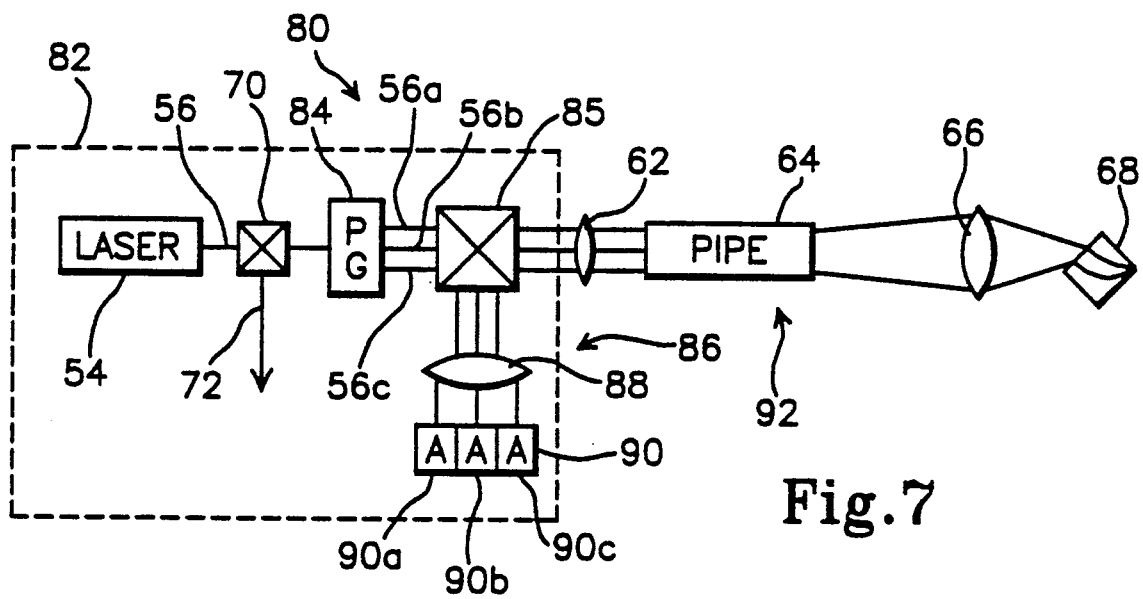

FIG. 7 illustrates a four pass PC MOPA 80 including a light source unit 82 incorporating the laser 54 and optical beam switching unit 70. The light source unit 82 further includes a phase grating 84 which splits the light beam 56 into the input beams 56a, 56b and 56c. An optical beam switching unit 85 switches the beams 56a, 56b and 56c into a leg 86 of the apparatus 80 which includes a beam distribution optical unit 88 symbolically illustrated as a converging lens. The unit 88 directs the beams 56a, 56b, and 58c into a power amplifier array 90 which may include laser diode amplifier cells 90a, 90b and 90c. The array 90 differs from the array 60 in that the cells 90a, 90b, and 90c have internal reflective surfaces which reflect the input beams 56a, 56b, and 56c respectively back along their axis after amplification. After double passing the amplifier array 90, the light beams 56a, 56b and 56c are switched by the unit 85 into another leg 92 of the apparatus 80 which includes the light pipe 64, phase conjugate mirror 68, and optical units 62 and 66. The input beams 56a, 56b and 56c are combined in the light pipe 64 in the manner described above, reflected back through the light pipe 64 by the mirror 68, and switched back into the leg 86 by the unit 85 where they make two more passes through the amplifier array 90. The beams 56a, 56b and 56c are then switched to the optical beam splitting unit 70 and directed out of the apparatus 80 as the output beam 72. Any aberrations introduced in the first two passes through the array 90 are reversed by the optical phase conjugation process in the second two passes.

EXAMPLE

Figure 8:
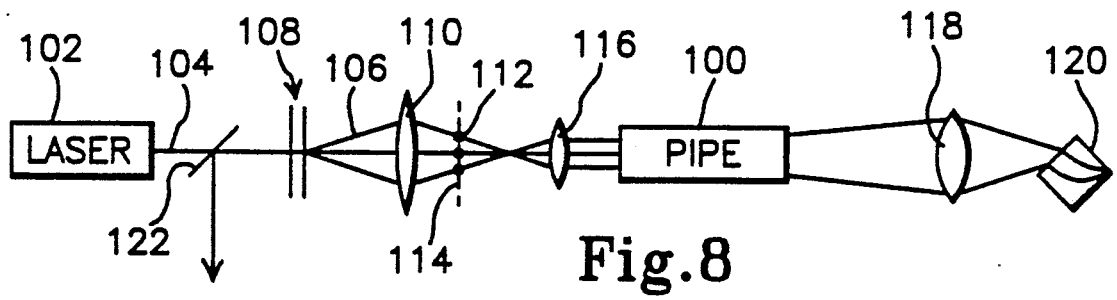
FIG. 8 is a diagram illustrating an example of the present invention.

A light pipe system was fabricated using an 81 light beam (9×9) array to simulate a PC MOPA as illustrated in FIG. 8. A light pipe 100 which was 20 cm long and had a 3 mm square cross section was fabricated from BK-7 glass manufactured by Schott Glass Technologies, Inc., of Duryea, Penna., using a pitch polish. The entrance and exit faces of the light pipe 100 were anti-reflection coated to reduce Fresnel reflection losses. The light pipe 100 was supported at only three small contact points near its ends, and placed in an enclosure to keep dirt and dust off the surface. This was done to avoid spoiling the TIR. Another way to avoid spoiling the TIR is encapsulate the side walls of the light pipe in a hard polymer cladding of low refractive index as is done with some high numerical aperture optical fibers. This would, however, lower the numerical aperture of the light pipe to around 0.48 (F/0.91), but the pipe would still be usable for most practical scenarios where the limiting aperture of the system is determined by the first and second optical units (typically F/4 or greater).

A diode laser 102 produced a coherent, diffraction limited light beam 104 at a wavelength of 830 nm which was split into 81 input light beams collectively designated as 106 by a pair of orthogonally oriented binary phase gratings 108, each of which split an incident light beam into 9 light beams. A converging lens 110 was used to form each of the resulting 81 input light beams 106 into a Gaussian beam waist illustrated at 112 in the drawing. The array of beam waists 112 simulated the near field exit facets of a diode power amplifier array, and was the location where an aberrator plate 114 was placed to simulate power amplifier aberrations.

A first optical unit 116 imaged the simulated diode array 112 onto the entrance face of the light pipe 100 in accordance with the above conditions (1) to (4) with the E polarization parallel to the horizontal walls of the light pipe 110. Each of the 81 images were 41 microns high and 50 microns wide. The vertical spacing between the light beams was 330 microns, whereas the horizontal spacing therebetween was 250 microns. A second optical unit 118 imaged the exit face of the light pipe 100 to a spot approximately 0.75 mm square in a phase conjugate mirror 120 formed from a 5 mm cubic barium titanate crystal. After phase conjugation in the mirror 120, the light beams were reflected back on themselves, passing back through the light pipe 100 and associated elements. Due to the action of the phase conjugation, the 81 beams reformed back into one beam after passage through the phase gratings 108. A portion of the recombined beam was then reflected out of the system by a beam splitting mirror 122.

Good results were obtained from the system despite the relatively simple construction of the light pipe 100 which had a number of chips in the corners of the walls. Single pass transmission loss in the pipe 100 was only 5%, and no polarization scrambling was observed even for beams which were distorted to the equivalent of ten times the diffraction limit. After passing through the pipe 100, the 81 light beams 106 were observed to fill the exit face completely and exhibited good overlap. Ripples which were observed in vertical and horizontal optical scans of the exit face of the light pipe 100 were interference fringes between the coherent beams 106, and not the individual beams themselves.

The return beams were observed prior to recombination at the phase gratings 108, and in all cases had the same relative intensities as the respective input beams, indicating remarkably good conjugation fidelity. Phase conjugate reflectivities greater than 50% were typically observed with laser input powers of about 5 mW at the location of the mirror 120.

Good conjugation fidelity was also observed photographically in the far fields of the input and recombined output beams. The output beam central lobe had the same diffraction limited characteristics as the input beam, with output beam sidelobes evident only at high exposure levels. Quantitative measurements of the sidelobes indicated that they were 12 to 20 dB lower in power than the main lobe. Sidelobe suppression would have been even greater if some of the light (and information) had not been lost from the optical system due to partially curved end faces of the light pipe 100.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. An optical beam combining apparatus, comprising:
    optical light pipe means having first and second ends;
    light source means for providing a plurality of input light beams to the first end of said optical light pipe means, at least two of said input light beams having differing divergences within a range of divergences;
    said optical light pipe means positioned for the first end to receive substantially the full input beams having said divergences within the boundaries of the first end, said light pipe means being long enough for said input beams to overlap and each substantially completely fill the light pipe means at said second end over said range of divergences; and
    optical phase conjugate mirror means positioned to receive said overlapped beams emitted from the second end of said light pipe means to phase conjugate said beams and to reflect them back into the second end of the light pipe means, said light pipe means providing a substantially constant overlapped beam size to said phase conjugate mirror despite variations in the divergences of said input beams over said range.

2. An apparatus as in claim 1, in which the light source means comprises a light source for producing a single light beam, and beam splitting means for splitting the single light beam to produce the input light beams.

3. An apparatus as in claim 2, in which the light source means further comprises optical amplifier means for amplifying the input light beams passing from the beam splitting means to the light pipe means, and for amplifying said phase conjugate reflected light beams which emerge from the first end of the light pipe means, the input beam divergences varying in accordance with the degree of amplification provided by said optical amplifier means.

4. An apparatus as in claim 3, in which the light source means further comprises second beam splitting means disposed between the light source and the amplifier means for directing said phase conjugate reflected light beams after amplification by the amplifier means external of the apparatus.

5. An apparatus as in claim 1, further comprising optical means disposed between the light source means and the light pipe means for focussing the input light beams onto the first end of the light pipe means such that the input light beams collectively just fill the first end thereof for the maximum input beam divergence within said range.

6. An apparatus as in claim 1, in which the light pipe means has a length selected such that each input light beam diverges to just fill the second end thereof under diffraction limited conditions.

7. An apparatus as in claim 1, further comprising optical means for focussing said overlapping light beams emerging from the second end of the light pipe means into the phase conjugate mirror means at a predetermined position therein and with a predetermined beam diameter.

8. An apparatus as in claim 1, in which the light pipe means has a rectangular cross section with walls extending in first and second orthogonal directions, the light source means being constructed to direct the input light beams into the first end of the light pipe means such that the input light beams have first and second orthogonal polarizations oriented in the first and second orthogonal directions respectively.

9. An apparatus as in claim 1, in which the light source means produces the input light beams such that they are substantially parallel to each other.

10. A method of processing a plurality of diverging input light beams by optical phase conjugation, at least two of said input light beams having differing divergences within a range of divergences, said method comprising the steps of:
    (a) directing the beams into one end of an optical light pipe having first and second ends so that the beams overlap each other within said light pipe;
    (b) allowing the beams to continue diverging within the light pipe and fully occupy said light pipe face at its second end over said range of divergences; and
    (c) directing said fully overlapped beams from the second end of said light pipe into a phase conjugate mirror such that said fully overlapped beams are reflected back from the phase conjugate mirror into the second end of the light pipe.

11. A method as in claim 10, in which the input light beams are focused onto the first end of the light pipe such that the input beams collectively just fill the first end thereof for the maximum input beam divergence within said range.

12. A method as in claim 10, in which the light pipe has a length selected such that each input light beam diverges to just fill the second end thereof under diffraction limited conditions.

13. A method as in claim 10, comprising the step of focussing said overlapping light beams emerging from the second end of the light pipe into the phase conjugate mirror at a predetermined position therein and with a predetermined beam diameter.

14. A method as in claim 10, in which said light pipe has a rectangular cross section with walls extending in first and second orthogonal directions; and
    the input light beams are directed into the first end of the light pipe such that the input light beams have first and second orthogonal polarizations oriented in the first and second directions respectively.

15. A method as in claim 10, in which the input light beams are directed into the first end of the light pipe substantially parallel to each other.

16. A phase conjugate, master oscillator power amplifier apparatus including light source means for producing a light beam, beam splitting means for splitting said light beam to produce a plurality of input light beams, optical power amplifier means for amplifying the input light beams, said power amplifier means causing each of said input light beams to diverge over a range of divergences in accordance with the degree of amplification imparted to said input light beams, at least two of said input light beams having differing divergences, and phase conjugate mirror means for phase conjugating the input light beams which emerge from the power amplifier means and reflecting the phase conjugated light beams back through the power amplifier means, characterized by comprising:
    optical light pipe means having a first end facing the power amplifier means and a second end facing the phase conjugate mirror means;
    first optical means disposed between the power amplifier means and the light pipe means for focussing the input light beams fully onto the first end of the light pipe means within the boundaries of the first end, said light pipe means being long enough for said input beam to overlap and each substantially completely fill the face of the light pipe means at said second end; and second optical means disposed between the second end of the light pipe means and the phase conjugate mirror means for focussing said overlapping light beams emerging from the second end of the light pipe means into the phase conjugate mirror means at a predetermined position therein and with a predetermined beam diameter.

17. An apparatus as in claim 16, in which the power amplifier means and phase conjugate mirror means are disposed in line with each other in a two-pass configuration.

18. An apparatus as in claim 16, in which the power amplifier means and phase conjugate mirror means are disposed in first and second legs respectively in a four-pass configuration, the apparatus further comprising optical switching means for operatively switching said light beams into and out of the first and second legs.

19. An apparatus as in claim 16, in which the light pipe means has a length selected such that each input light beam diverges to just fill the second thereof under diffraction limited conditions.

20. An apparatus as in claim 16, in which the light pipe means has a rectangular cross section with walls extending in first and second orthogonal directions, the first optical means being constructed to focus the input light beams onto the first end of the light pipe means such that each input light beam has first and second orthogonal polarizations oriented in the first and second orthogonal directions respectively.

21. An apparatus as in claim 16, in which the first optical means focusses the input light beams onto the first end of the light pipe means such that they are substantially parallel to each other.

22. A method of processing by optical phase conjugation a plurality of diverging input light beams with at least two of said input light beams having differing divergences within a range of divergences, said method comprising the steps of:

(a) directing the beams into one end of an optical fiber, said beams overlapping each other within said fiber;

(b) restricting the outer boundaries of said overlapping beams as said beams diverge so that said beams fully overlap and occupy a predetermined spatial area at another end of said optical fiber, said area being independent of the degree of divergence of said beams within said range; and (c) directing said fully overlapped beams into a phase conjugate mirror such that said beams are reflected back from the phase conjugate mirror to said predetermined spatial area.

* * * * *